(12) United States Patent
Sasaki

(10) Patent No.: US 6,707,092 B2
(45) Date of Patent: Mar. 16, 2004

(54) SEMICONDUCTOR MEMORY HAVING LONGITUDINAL CELL STRUCTURE

(76) Inventor: Masayoshi Sasaki, c/o Sony Corporation, 7-35, Kitashinagawa 6-Chome, Shinagawa-Ku, Tokyo (JP)

( * ) Notice: Subject to any disclaimer, the term of this patent is extended or adjusted under 35 U.S.C. 154(b) by 0 days.

(21) Appl. No.: 10/194,723

(22) Filed: Jul. 12, 2002

(65) Prior Publication Data

US 2003/0030090 A1 Feb. 13, 2003

(30) Foreign Application Priority Data

Jul. 16, 2001 (JP) ......................................... 2001-214904

(51) Int. Cl.[7] .................................................. H01L 27/108
(52) U.S. Cl. ........................ 257/301; 257/68; 257/71; 257/296; 257/298; 257/905; 257/906; 257/908
(58) Field of Search ....................... 257/68–71, 296–313, 257/905–908

(56) References Cited

U.S. PATENT DOCUMENTS

| | | | | |
|---|---|---|---|---|
| 4,830,978 A | * | 5/1989 | Teng et al. .................. | 438/249 |
| 5,006,909 A | * | 4/1991 | Kosa .......................... | 257/302 |
| 5,008,214 A | * | 4/1991 | Redwine ..................... | 438/243 |
| 5,065,273 A | * | 11/1991 | Rajeevakumar ............. | 361/313 |
| 5,103,276 A | * | 4/1992 | Shen et al. .................. | 257/302 |
| 5,888,864 A | * | 3/1999 | Koh et al. ................... | 438/253 |
| 5,977,579 A | * | 11/1999 | Noble ......................... | 257/302 |
| 5,985,729 A | * | 11/1999 | Wu ............................. | 438/389 |
| 6,114,725 A | * | 9/2000 | Furukawa et al. .......... | 257/330 |
| 6,137,128 A | * | 10/2000 | Holmes et al. ............. | 257/301 |
| 6,329,239 B2 | * | 12/2001 | Koh et al. ................... | 438/253 |

* cited by examiner

Primary Examiner—Son L. Mai
Assistant Examiner—Andy Huynh
(74) Attorney, Agent, or Firm—Robert J. Depke; Holland & Knight LLP

(57) ABSTRACT

In a semiconductor memory including a dynamic random access memory, a memory cell of the dynamic random access memory includes: a semiconductor pillar (a silicon pillar); a capacitor in which one side of the silicon pillar is used as a charge accumulation electrode; and a longitudinal insulated gate static induction transistor in which the other side of the silicon pillar is used as an active region (a source region, a channel formation region and a drain region), and a bit line is connected to the silicon pillar.

7 Claims, 10 Drawing Sheets

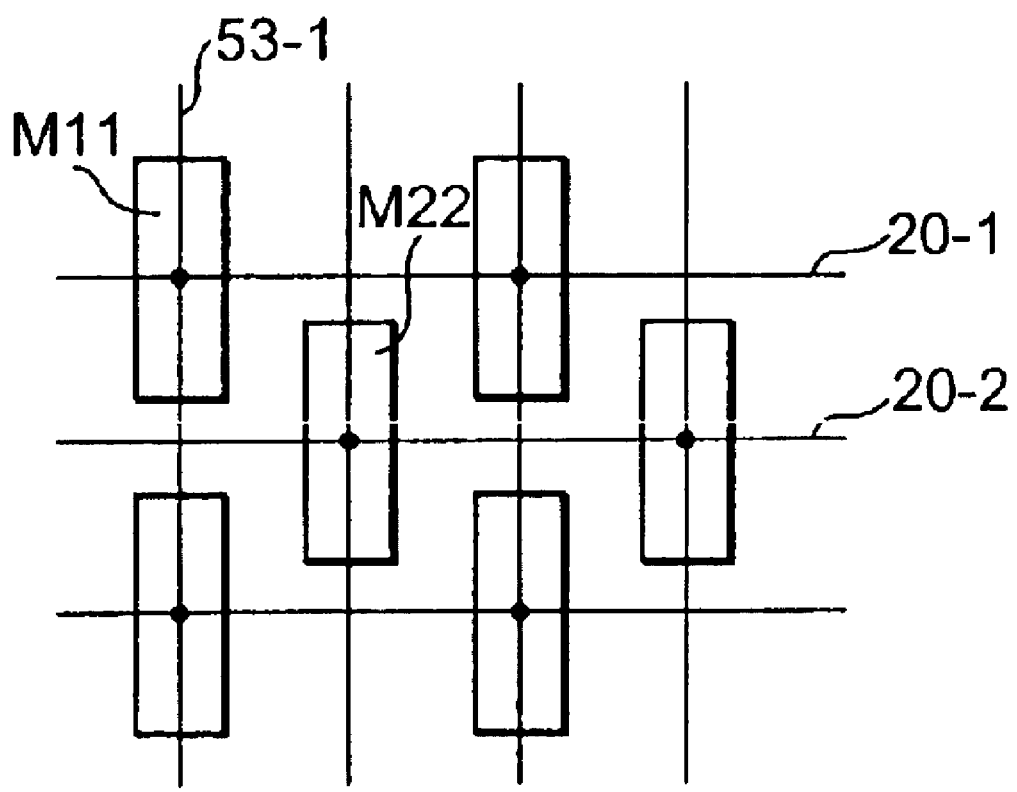

SEMICONDUCTOR MEMORY HAVING LONGITUDINAL CELL STRUCTURE

CROSS REFERENCES TO RELATED APPLICATIONS

The present document is based on Japanese priority documents JP 2001-214904, filed in the Japanese patent office on Jul. 16, 2001, the entire contents of which being incorporated herein by reference.

BACKGROUND OF THE INVENTION

1. Field of the Invention

The present invention relates to a semiconductor memory and a method of manufacturing the same, and more particularly relates to a dynamic random access memory that is a semiconductor memory with capacitors and a method of manufacturing the same.

2. Description of Related Art

A dynamic random access memory (hereafter, referred to as DRAM) of a semiconductor memory is provided with single cell transistor 211 and single capacitor 221, as shown in FIG. 11A. A gate of the cell transistor 211 is connected to a word line 231. Further, one diffusion layer of the cell transistor is connected to a bit line 241, and the other diffusion layer of the cell transistor 211 is connected to one electrode of the capacitor 221. Furthermore, the other electrode of the capacitor is connected to a plate electrode.

A memory cell of single-transistor-single-capacitor type having the above mentioned configuration is widely used since it has an advantage over other memory devices in achieving a higher degree of integration. However, there is always demands for even higher degree of integration in DRAM. Enormous efforts have been tried to advance miniaturization of such memory cells.

As a typical DRAM cell, a stack type capacitor cell and a trench type capacitor cell have been put to practical use until now. However, in order to form the memory cells of these types, it is inevitable that their structures become more complex if further reduction of cell area is attempted.

The DRAM memory comprises: a capacitor for accumulating memory charge, a transistor for receiving and outputting the charge, a bit line that is connected to the transistor for writing and reading data, and a word line to control on/off switch action of the transistor. In the DRAM memory cell, major development effort has been spent on how to reduce its cell size.

The reduction of the cell size while maintaining a required amount of the charge to be accumulated in the capacitor of the cell is one of most important issues of the development. Instead of a memory cell in which a capacitor is formed in a flat layout referred to as a planer type, the above mentioned cell structures such as the trench type, the stack type or the like are employed to make the capacitor structure three-dimensional in order to increasing the amount of charging capacitance within a smaller area size. Furthermore, as a material having a higher dielectric constant, for example, tantalum oxide ($Ta_2O_5$) and the like are used as an insulation film of the capacitor.

It is popular to use memory cells configured with a folded bit line system as shown in FIG. 11B. Such memory cells have been known to share a higher noise resistance characteristic found in conventional cell read-out operation. However, it is also known that the minimum memory cell area can not be less than $8F^2$ in such memory cell if the minimum machining dimension is assumed to be F. In order to attain less memory cell size, it is desirable to employ a layout configuration referred to as an open bit line system. FIGS. 11B, 11C show connection diagrams of the memory cells having configurations of the folded bit line system and the open bit line system, respectively.

As shown in FIG. 11, in memory cells with the folded bit line system, memory cells 201, each of which comprises the cell transistor 211 and the capacitor 221, are arranged so as to be connected to every other line of the word lines 231 between the bit lines 241. Further, the memory cells 201 are arranged so as to be connected to every other line of the bit lines 241 between word lines 231.

As shown in FIG. 11C, in memory cells with the open bit line system, the memory cell comprises the cell transistor 211 and the capacitor 221 and arranged so as to be connected to each word line 231 between the bit lines 241.

SUMMARY OF THE INVENTION

However, in view of improving the degree of integration in the DRAM, a more complex structure may have to be employed in order to form the memory cell of the stack type capacitor cell or the trench type capacitor cell if further miniaturization of the memory cell and further reduction of the cell area are tried.

There is constant demand for further reduction of the memory cell size. It is desirable to provide a memory cell that can be manufactured with simpler and easier process while securing cell charge of about 30 fC (femto-coulomb) that is required to maintain storage of data in the memory.

According to the present invention, a semiconductor memory apparatus is provided to solve or alleviate the above-mentioned problems.

The semiconductor memory according to an embodiment of the present invention comprises a dynamic random access memory. A memory cell of the dynamic random access memory comprises: a semiconductor pillar; a capacitor in which one side of the semiconductor pillar is used as the capacitor's electrode; and a longitudinal insulated gate static induction transistor in which the other side of the semiconductor pillar is used as an active region of the transistor. Furthermore, a bit line is connected to the semiconductor pillar.

In the semiconductor memory, the capacitor for accumulating charge, the insulated gate static induction transistor and the bit line are configured so that they are piled up in a longitudinal direction. Separations between the respective memory cells are realized with a plate electrode of the capacitor embedded in a groove. Accordingly, a smaller average plane area occupied by the memory cell may be achieved.

Furthermore, in the memory cell, the longitudinal insulated gate static induction transistor is used as a word transistor of the memory cell. Accordingly, even if gate length of the transistor is made longer, it does not cause increasing of a cell area size. It is possible to accommodate sufficient margin in the gate length of the transistor. Furthermore, an amount of charge accumulated in the capacitor may be increased by extending length of the charge accumulation portion to a depth direction. Accordingly, the required capacitance may be secured without having any severe limitation even if the miniaturization is advanced further.

According to another embodiment of the present invention, a method of manufacturing a semiconductor memory is provided. Such method includes forming of a substrate by forming three layers one by one. The three layers are, from the bottom side, a semiconductor substrate of a first conductive type, a first semiconductor layer of a second conductive type, and a second semiconductor layer of a second conductive type having a lower concentration than that of the first semiconductor layer.

The method further includes forming of a groove, which is trenched in the semiconductor substrate, on a predetermined region of the substrate, and forming of a semiconductor pillar in form of a pillar, which is mainly composed of the first semiconductor layer and the second semiconductor layer, between the grooves.

The method further includes forming of a plate electrode of a capacitor by embedding conductor (electrical conducting material) via the semiconductor substrate, the first semiconductor layer and a capacitor insulation film in the groove, in such a way that the conductor faces the first semiconductor layer within the groove.

The method further includes forming of a word line, which includes a gate electrode of an insulated gate static induction transistor, by embedding conductor via the plate electrode, the first semiconductor layer, the second semiconductor layer and an insulation film, The conductor is configured in such a way that the formed conductor body faces the second semiconductor layer on the plate electrode.

The method further includes forming of a drain region of the insulated gate static induction transistor composed of a second conductive type semiconductor region of a higher concentration than that of the second semiconductor layer on a top surface of the semiconductor pillar.

The method further includes forming of an interlayer insulation film on the substrate, and then forming a bit line of a memory cell array connected to the drain region, on the interlayer insulation film.

According to the method of manufacturing the semiconductor memory, the capacitor for accumulating charge, the insulated gate static induction transistor and the bit line are formed in the structure in which they are longitudinally piled up, and the separation between the respective memory cells are realized with the plate electrode of the capacitor embedded in the groove. Accordingly, a smaller average plane area occupied by the memory cell may be achieved.

In the present embodiment, the conductor is embedded via the thin insulation film so as to form the plate electrode after the formation of the groove, and the conductor is embedded via the insulation film so as to form the word line. Accordingly, the process is made easier. Furthermore, formation of a fine contact within the memory cell is done only by forming a bit contact to connect the bit line. Accordingly, the process is simplified and load is decreased.

Furthermore, the gate length of the longitudinal insulated gate static induction transistor is directed to the depth direction. Accordingly, it does not cause increasing of a cell area size even if the gate length of the transistor is made longer. Furthermore, it is possible to form the transistor of the gate length with sufficient margin. Furthermore, the charges capacitance accumulated in the capacitance may be made greater by increasing the length of the charge accumulation portion to the depth direction. Accordingly, the capacitor with a large capacitance may be formed without any severe limitation on the occupied surface area even if the miniaturization is further advanced. That is, the capacitor with a sufficient amount of the capacitance may be formed.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 8 is a circuit diagram describing the second embodiment according to the semiconductor memory of the present invention;

DESCRIPTION OF THE PREFERRED EMBODIMENTS

First, a static induction transistor that is a key building block of the present invention is explained. The static induction transistor may be considered as one type of junction FETs (Field Effect Transistors). A typical configuration of the static induction transistor will be described below.

In the static induction transistor, a channel portion having a low concentration N-type silicon layer placed between a pair of high concentration N type silicon layers. P type silicon gates are formed in the upper and lower portions of the channel portion. A PN junction is formed between the gate and the channel. A reverse bias is applied on such junction. If the reverse bias is large (deep), a gate potential prevents current flow between a source and a drain since the channel portion is completely depleted. However, if the reverse bias is low (shallow), the potential between the channels is dropped so that the current starts to flow between the source and the drain.

Furthermore, in the static induction transistor of a insulated gate type, the gate portion comprises a gate oxide film and a gate electrode. Even in this case, the current between the source and the drain is controlled by the potential barrier in the channel portion controlled in the gate electrode. The insulated gate type has a high input impedance. Thus, it has a merit of operating with a low power consumption. A difference from a MOS transistor is that the current does not flow via an inversion layer and the current flows via a bulk portion since the channel portion has the same conductive type as the source and the drain. Furthermore, the static induction transistor does not require overlap between the gate portion and the source drain. Hence, it has a merit of having less restriction on fabricating the device in a longitudinal structure.

Figure 1A:
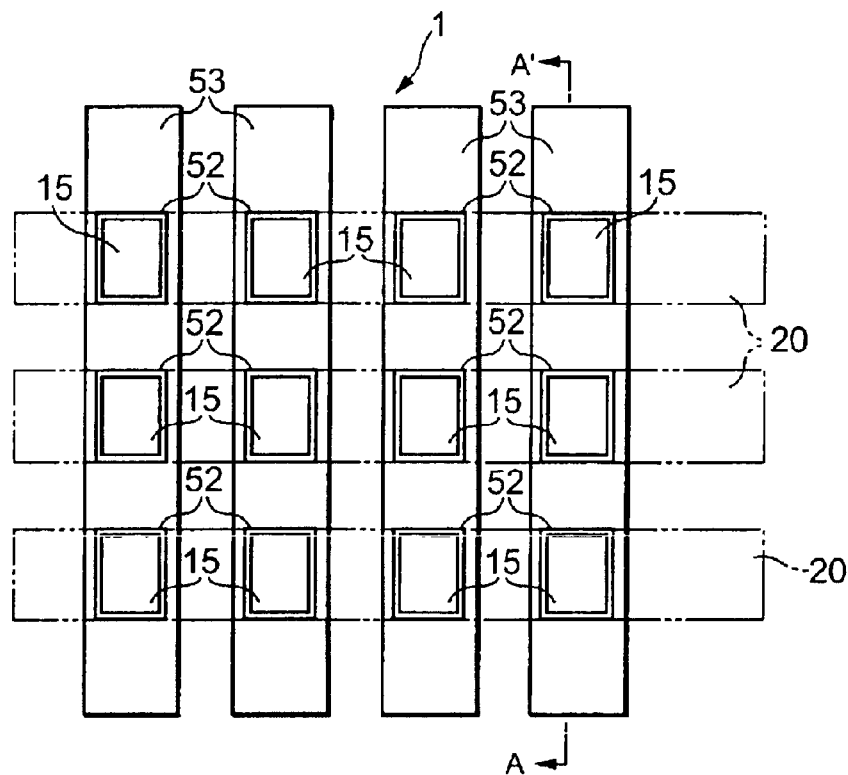
FIG. 1A is a lay out plan view showing a first embodiment according to a semiconductor memory of the present invention.
Figure 1B:
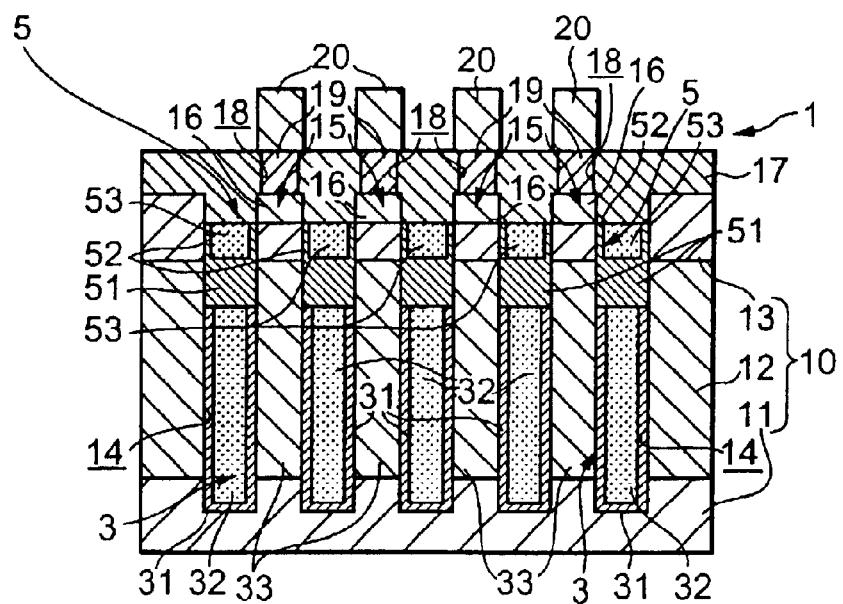
FIG. 1B is a sectional view of a schematic configuration on an A—A' line of FIG. 1A.

A semiconductor memory according to a first embodiment of the present invention will be described below with reference to FIGS. 1A, 1B. FIG. 1A shows a layout plan view, and FIG. 1B shows a sectional view of a schematic configuration on an A—A' line. FIG. 1B shows the schematic configuration and the scale of FIG. 1B is not the same as that of FIG. 1A.

As shown in FIGS. 1A, 1B, a first semiconductor layer 12 composed of a second conductive type (N+ type) of a high concentration, in which a polarity is opposite to that of a first conductive type, is formed on a semiconductor substrate 11 of a first conductive type (hereafter, referred to as a P type). A silicon substrate of the P type is used in the semiconductor substrate 11. Further, an N+ type silicon layer is used in the first type semiconductor layer 12. A second semiconductor layer 13 of a second conductive type (N- type) of a lower concentration than the first semiconductor layer 12 is formed on the first semiconductor layer 12. The second semiconductor layer 13 comprises a silicon layer of the N- type. A substrate 10 is configured as mentioned above.

A groove 14 reaching the semiconductor substrate 11 from the second semiconductor layer 13 is formed on a predetermined region of the substrate 10. This predetermined region is a grid-shaped region within a region where a memory cell array is formed. After it is separated by the grid-shaped groove 14, semiconductor pillars (hereafter, referred to as silicon pillars) 15 are arrayed in a shape of a matrix when they are viewed on a flat surface.

Conductor (electrical conducting material such as doped poly-silicon, high melting point metal, metallic silicide or metal) is embedded via a capacitor insulation film 31 in the groove 14 so that the conductor is positioned at a lower than the first semiconductor layer 12. The conductor is included in a capacitor plate electrode 32. Thus, the capacitor plate electrode 32 is insulated from the semiconductor substrate 11 and the first semiconductor layer 12 via the capacitor insulation film 31.

A portion corresponding to the first semiconductor layer 12 of the silicon pillar 15 is doped at a high concentration, and it functions as a charge accumulation electrode 33 of the capacitor in the DRAM. The capacitor insulation film 31 is mainly composed of nitride silicon film, and it is, for example, formed at a film thickness of 2 nm or more and 10 nm or less, and preferably formed at a film thickness of 2 nm or more and 5 nm or less. The formation having the above-mentioned film thickness enables capacitance of the capacitor to be maximized and also enables the large charge accumulation amount to be maintained.

For example, if the silicon pillar 15 is formed in a shape of a cylinder having a diameter of 0.1 µm, the capacitance of about 39 fF (femto-farad) is obtained when a thickness of the capacitor insulation film 31 comprising the nitride silicon film is assumed to be 5 nm. Such capacitance value is a sufficient for the capacitor of the DRAM. On the other hand, when the minimum line width is assumed to be F, the cell size may be configured at about $4F^2$. Here, the value of $4F^2$ is obtained in view of the case in which margin is provided for matching of a mask or easiness of process. This leads to large reduction compared with the conventional value of $8F^2$ even if such margins are taken into consideration.

Furthermore, insulation films 51 are formed on the plate electrode 32 within the groove 14 and on a side wall between the first semiconductor layer 12 and the second semiconductor layer 13. The insulation film 51 on the plate electrode 32 is formed at a film thickness at which the insulation can be secured between the plate electrode 32 and a word line 53 formed on the insulation film 51. For example, the insulation film 51 is formed at a thickness of about 0.2 µm. The insulation film 51 formed on a side wall between the first semiconductor layer 12 and the second semiconductor layer 13 comprises, for example, oxide silicon, and formed, for example, at a film thickness of between 2 nm and 10 nm, and preferably formed at a film thickness of between 2 nm and 5 nm. The insulation film 51 functions as a gate insulation film 52. Here, the gate insulation film 52 is formed at a thickness of 10 nm.

Further, conductor is embedded on the plate electrode 32 within the groove 14 via thickly formed portion of the insulation film 51 and the gate insulation film 52. The word line 53 (including the gate electrode of the insulated gate static induction transistor) is constituted by the conductor (for example, doped poly-silicon, high melting point metal, metallic silicide or metal). Thus, in the insulation film 51, the thickly formed portion insulates and separates the plate electrode 32 of the capacitor and the word line (gate electrode) 53.

Further, a semiconductor region of a second conductive type (N+ type) having a higher concentration than the second semiconductor layer 13 is formed on the top surface of the silicon pillar 15. This N type semiconductor region becomes a drain region 16 in the insulated gate static induction transistor. The concentration of the drain region 16, for example, may be assumed to be at the same level as that of the first semiconductor layer 12. Further, the second semiconductor layer 13 under the drain region 16 functions as a channel formation region, and the upper portion of the first semiconductor layer 12 functions as a source region. Accordingly, the source region is formed on the upper portion of the charge accumulation electrode 33. Further, the first semiconductor layer 12 opposite to the plate electrode 32 via the capacitor insulation film 31 functions as the charge accumulation electrode 33.

Furthermore, an interlayer insulation film 17 is formed on the second semiconductor layer 13 in such a way that the interlayer insulation film 17 covers the silicon pillar 15. The interlayer insulation film 17 comprises, for example, an oxide silicon film having a thickness of about 0.5 µm, and its surface is planarized. A connection hole 18 reaching the drain region 16 formed on the silicon pillar 15 is formed on the interlayer insulation film 17. A plug 19 connected to the drain region 16 is formed within the connection hole 18. Furthermore, a bit line 20 of a memory cell array is connected on the interlayer insulation film 17, so as to be connected to the plug 19.

In the insulated gate static induction transistor 5 having the above-mentioned configuration, a current flows in longitudinal direction. Accordingly, a longitudinal insulated gate static induction transistor is provided.

Under the above-mentioned configuration, as shown in the flat plane layout view of FIG. 1A, in a layout of the cell array, one cell is placed at a portion where the bit line 20 and the word line 53 intersect. That is, it is the layout referred as the open bit line formation or a cross point cell formation. Accordingly, it is possible to achieve a high degree of integration in the memory cells.

On the other hand, the word line 53 is placed so as to surround the second semiconductor layer 13 of the silicon pillar 15. Thus, a portion corresponding to the second semiconductor layer 13 becomes a region in which a channel of the insulated gate static induction transistor 5 is formed.

In the semiconductor memory 1, the memory cell of the dynamic random access memory is provided with: the silicon pillar 15; the capacitor 3 in which one side of the silicon pillar 15 is used as the electrode (the plate electrode 32); and the longitudinal insulated gate static induction transistor 5 in which the other side of the silicon pillar 15 is used as the active regions (the drain region 16, the channel formation region and the source region) of the memory cell transistor.

The semiconductor memory 1 is configured in such a way that the capacitor 3 for accumulating charge, the insulated gate static induction transistor 5 and the bit line 20 are longitudinally piled up. And separations between the respective memory cells are realized by the plate electrode 32 of the capacitor 3 embedded in the groove 14. Accordingly, a smaller plane area occupied by the memory cell may be achieved. For example, the memory cell is reduced to the minimum by adjusting a width and interval of the groove 14 in accordance with a minimum design rule and adjusting a width and interval of the bit line 20 in accordance with a minimum design rule.

Further, in the memory cell, the longitudinal insulated gate static induction transistor 5 is used as the word transistor of the memory cell. Thus, even if gate length of the transistor is made longer, it does not cause the cell area to be increased. Hence, it is possible to have the gate length of the transistor with sufficient margin. A capacitance of the capacitor 3 for accumulating charge may be greater by extending length of the charge accumulation portion in the depth direction. Accordingly, the required capacitance may be secured without any severe limitation even if the miniaturization is further advanced.

A method of manufacturing a semiconductor memory according to a first embodiment of the present invention will be described below with reference to sectional views of schematic configurations of FIGS. 2A, 2B, 2C and FIG. 3. In FIGS. 2A, 2B, 2C and FIG. 3, the same numeric codes are given to the configuration elements similar to those described in FIGS. 1A, 1B.

Figure 2A:
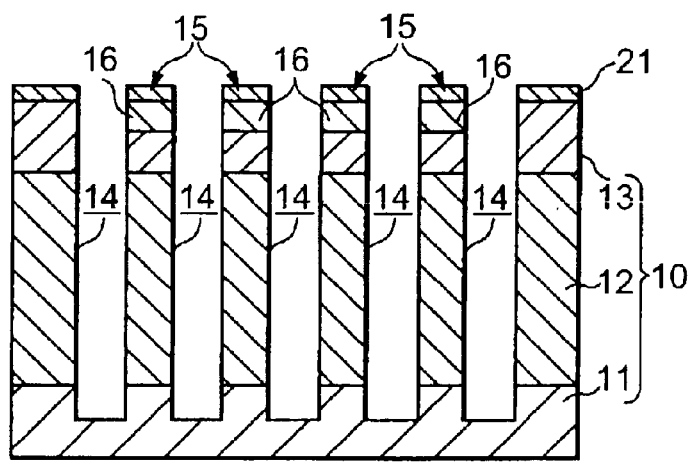
FIGS. 2A, 2B and 2C are sectional views of a schematic configuration showing a first embodiment according to a method of manufacturing the semiconductor memory of the present invention.

As shown in FIG. 2A, an epitaxial growth is utilized to form a first semiconductor layer 12, that has a higher concentration (N+ type) of the second conductive type in which the polarity is opposite to that of the first conductive type, on a semiconductor substrate 11 of the first conductive type (hereafter, referred to as P type). P type silicon substrate is used for the P type semiconductor substrate 11, and the first semiconductor layer 12 is formed by epitaxially growing the N+ type silicon layer to a thickness of, for example, 10 µm. Furthermore, a second semiconductor layer 13 of a lower concentration than that of the first semiconductor layer 12 is formed on the first semiconductor layer 12. The second semiconductor layer 13 is formed by depositing N-type silicon to form a layer with a thickness of, for example, 1.5 µm. The substrate 10 is formed as described above.

Furthermore, an ion implantation is used to implant arsenic ions into the region in which the memory cell array is formed, and then form on the surface the drain region 16 comprising a semiconductor region of the second conductive type (N+ type) with the higher concentration than that of the second semiconductor layer. As for the concentration of the drain region 16, for example, it is set at the same level as the first semiconductor layer. The drain region is formed, for example, at a thickness of 0.25 µm. Furthermore, an oxide silicon film 21 is formed on the second semiconductor layer 13 (a part of the drain region 16).

Next, a groove 14 reaching the silicon substrate 11 is formed. Accordingly, a semiconductor pillar (hereafter, referred to as the silicon pillar) 15 is formed between the grooves 14. The silicon pillar 15 becomes a charge accumulation portion of the memory cell and a portion in which a longitudinal insulated gate static induction transistor is formed.

Figure 2B:
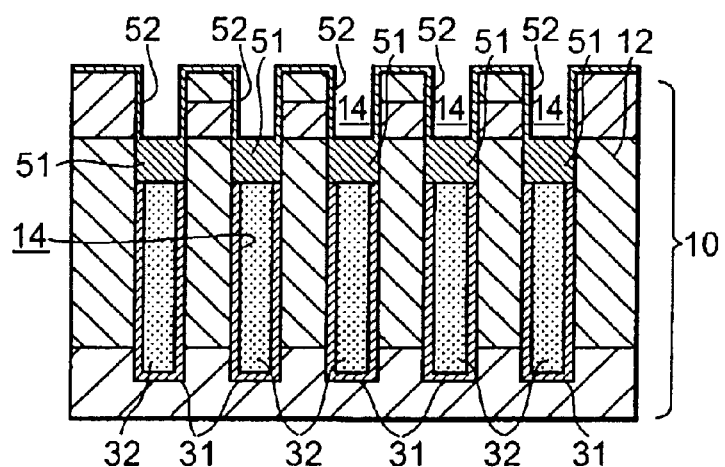

Next, as shown in FIG. 2B, a capacitor insulation film 31 is formed on the silicon surface within the groove 14, for example, by means of nitride silicon film. Furthermore, after conductor film is formed by depositing, for example, phosphorous doped poly-silicon on the capacitor insulation film 31 in such a way that the phosphorous doped poly-silicon is embedded in the groove 14, an etch-back process is carried out to thereby remove the conductor film from a surface and the upper portion of the groove 14. Thus, the conductor film is left only within the groove 14, and a plate electrode 32 of the capacitor is formed. At this time, a top surface of the conductor film is formed so as to have a height level equal or approximately equal to that of the first semiconductor layer 12 formed in the substrate 10.

Next, an exposed silicon surface is oxidized to grow a thick oxide film as insulation film 51 on the plate electrode 32 embedded in the groove 14. The oxide film extends up to side walls of the second semiconductor layer 13 of the silicon pillar 15 to form a thin film layer. The oxide film formed on the side wall becomes the gate insulation film 52 of the longitudinal insulated gate static induction transistor. Here, the oxidation is continued to form the gate insulation film 52 with the thickness of 10 nm.

Figure 2C:
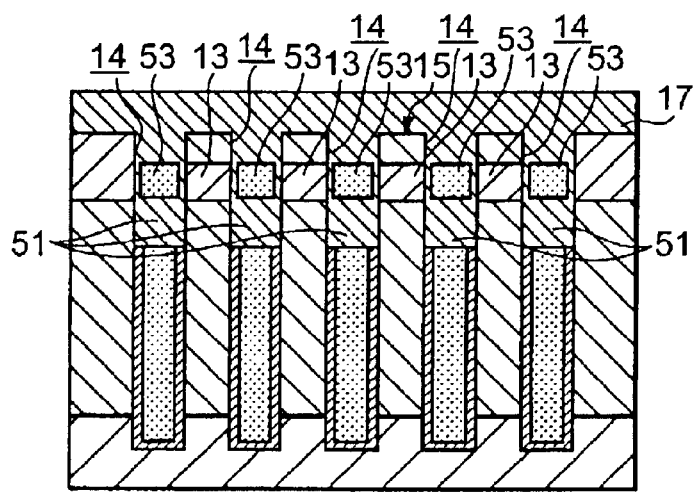

Next, as shown in FIG. 2C, the conductor film is formed, for example, by depositing the phosphorous doped poly-silicon on the insulation film 51 so that the formed conductor film is embedded in the groove 14. After that, a chemical mechanical polishing process is used to planarized a conductor film surface. Furthermore, the conductor film is etched in an isotropic manner so that the conductor film is left, for example, only on. the sides of the second semiconductor layer 13. Furthermore, an etching process utilizing a resist mask is carried out to process the conductor film to form a word line 53 (including the gate electrode).

Furthermore, an oxide silicon film is deposited on the entire surface, and a interlayer insulation film 17 is formed. Subsequently, a surface of the interlayer insulation film 17 is planarized, for example, by utilizing a chemical mechanical polishing process.

Figure 3:
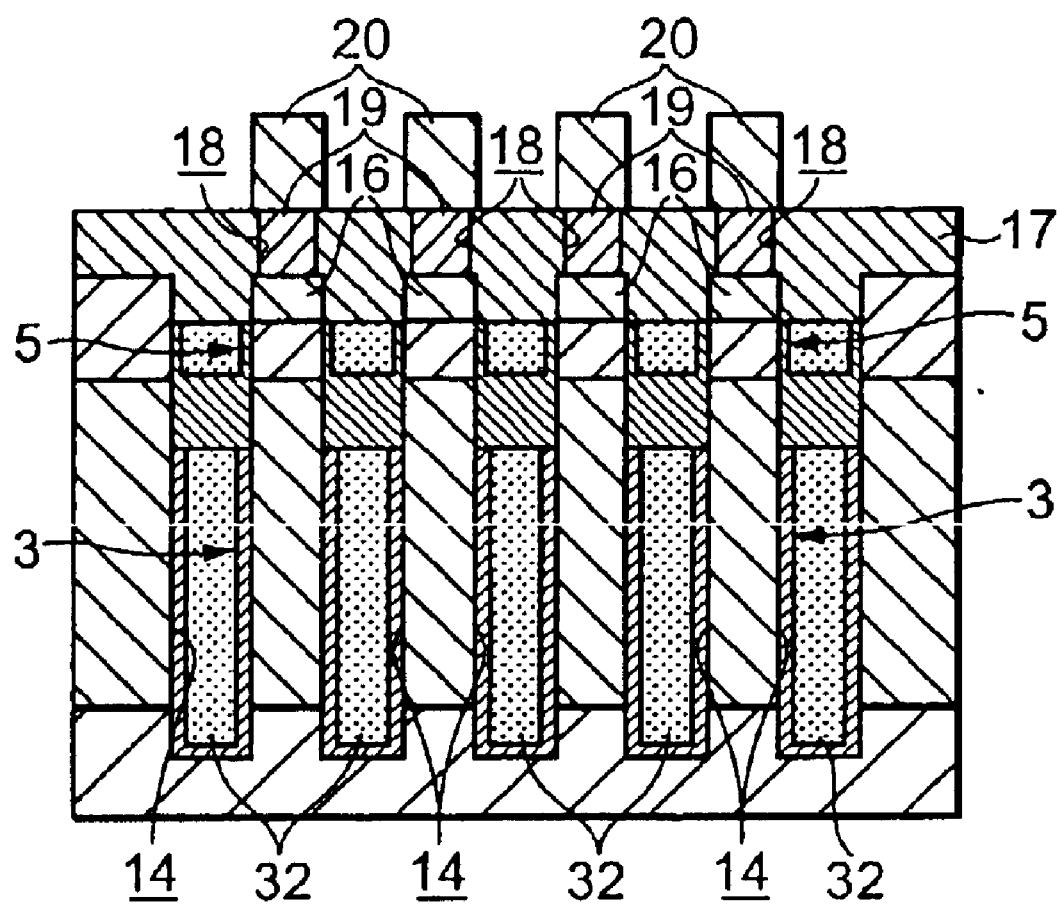
FIG. 3 is a sectional view of a schematic configuration showing the first embodiment according to the method of manufacturing the semiconductor memory of the present invention.

Next, as shown in FIG. 3, bit contacts are opened. A typical resist coating and lithography processes may be used to fabricate a mask pattern (not shown) to form connection holes serving as bit contact holes on the interlayer insulation film 17. Then, etching is carried out to thereby open the connection holes 18 on the interlayer insulation film 17.

After that, plugs 19 are formed within the connection hole 18. The plug 19 is formed by embedding conductor material (for example, doped poly-silicon) in the connection hole 18 and then removing excessive portions of the conductor formed outside the connection hole 18.

Furthermore, conductor film is formed for fabricating the bit line on the interlayer insulation film 17 including the plug 19. The conductor film may comprise, for example, tungsten film. Next, a mask pattern (not shown) comprising resist film is fabricated by using the lithography process after the resist film functioning as a mask that is to be used for bit line formation. The mask pattern is used so as to carry out an etching process and consequently form the bit line 20 comprising the conductor film connected to the drain region 16. The memory cell array similar to that described with reference to FIGS. 1A to 1C is formed by carrying out the above-mentioned processes.

In the method of manufacturing the semiconductor memory, the capacitor 3 for accumulating charge, the insulated gate static induction transistor 5 and the bit line 20 are formed in a structure in which they are longitudinally piled up, and separations between the respective memory cells are configured in the plate electrode 32 of the capacitor 3 embedded in the groove 14. Accordingly, a smaller average plane area occupied by the memory cell may be achieved.

After the formation of the groove 14, the conductor film 41 is embedded via the capacitor insulation film to thereby form the plate electrode 32. Furthermore, the conductor film is embedded via the insulation film 51 and the gate insulation film 52 to thereby form the word line 53. Thus, the process is made easier. Further, the formation of the fine contact within the memory cell is done only by forming the bit contact to connect the bit line 20. Thus, the process is simplified to thereby decrease loads.

Further, the gate of the longitudinal insulated gate static induction transistor 5 is extended in the depth direction. Thus, even if the gate length of the transistor is made longer, this does not cause increasing of a cell area size. Accordingly, it is possible to form a transistor with the gate length having sufficient margin. Further, a capacitance of the capacitor 3 for accumulating charge may be greater if a length of the charge accumulation portion is increased in the depth direction. Accordingly, even if miniaturization is further advanced, the capacitor having large capacitance may be formed without imposing any severe limitation on a size of the surface occupation area. As a result, the capacitor with sufficiently large capacitance may be obtained.

Figure 4A:
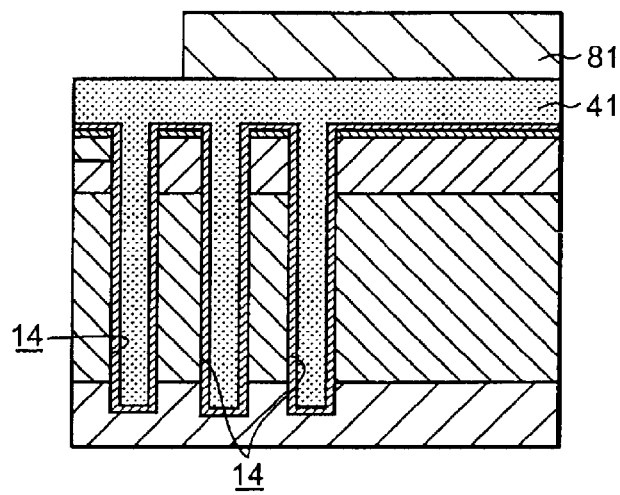
FIGS. 4A, 4B and 4C are sectional views of a schematic configuration showing a connecting method between a power supply wiring and conductor film embedded in a groove.
Figure 4B:
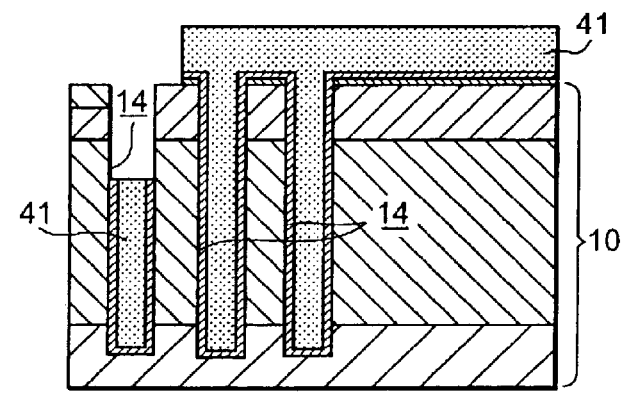
Figure 4C:
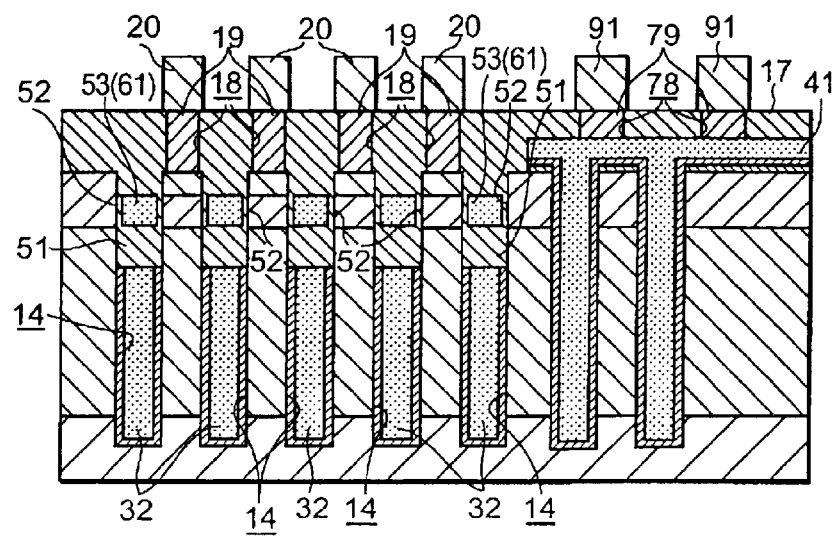

The conductor film comprising phosphorous doped poly-silicon embedded in the groove 14 functions as the plate electrode 32 of the capacitor 3 of the DRAM. In this case, in order to connect a power supply to the plate electrode 32, it is necessary to connect wiring and the conductor film to each other. FIGS. 4A, 4B and 4C are sectional views of schematic configurations to show the method of connecting the power supply wiring and the conductor film embedded in the groove.

As shown in FIG. 4A, after the conductor film 41 comprising phosphorous doped poly-silicon embedded in the groove 14 is deposited on the entire surface, a predetermined resist pattern 81 is formed so as to cover both regions, one of which is a part of a region where the groove 14 is formed and the other is a region where the groove 14 is not formed. Incidentally, at this time, the resist pattern 81 is designed so as not to be formed on the portion of the cell array region where the memory cell is formed. After that, anisotropic etching process (for example, a reactive ion etching) is carried out by utilizing the resist pattern 81 as the mask.

The etching is performed under etching condition of that the conductor film 41 is left only within the groove 14 in the memory cell region, as shown in FIG. 4B. For this reason, the etching is not performed in a region covered by the resist pattern 81 (refer to FIG. 4A). Thus, a part of the conductor film 41 is left on the substrate 10 while keeping its connection to the conductor film 41 within the groove 14. After that, the resist pattern 81 is removed.

As described in FIG. 2A, the grooves 14 are formed in grid-shape. Accordingly, all of the grooves 14 are connected to each other in a region in which a group of cell arrays are formed.

Next, as shown in FIG. 4C, by oxidizing the exposed silicon surface, oxide film is thickly grown as the insulation film 51 on the plate electrode 32 embedded in the groove 14. This oxide film is thinly formed on the side wall of the second semiconductor layer 13 in the silicon pillar 15, and it becomes the gate insulation film 52 of the longitudinal insulated gate static induction transistor 5. Here, the oxidization is done in such a way that thickness of the gate insulation film 52 becomes 10 nm. Furthermore, the upper layer portion of the conductor film 41 on the substrate 10 is oxidized as well.

Next, conductor film 61 is formed, for example, by depositing phosphorous doped poly-silicon on the insulation film 51 so as to be embedded in the groove 14. After that, a chemical mechanical polishing process is utilized for planarization of a surface of the conductor film 61. Furthermore, the conductor film 61 is isotropically etched so that the conductor film 61 is disposed, for example, only on a side of the second semiconductor layer 13 in the silicon pillar 15. Furthermore, an etching process utilizing a resist mask is carried out to process the conductor film 61 and consequently form the word line 53 (including the gate electrode).

Furthermore, oxide silicon film is deposited on the entire surface to thereby form the interlayer insulation film 17. After that, the surface of the interlayer insulation film 17 is planarized, for example, by utilizing a chemical mechanical polishing process.

Next, bit contacts are opened. A typical resist coating and lithography processes are used to form a mask pattern (not shown) that will be used to form connection holes serving as electrode extracting portions and bit contact holes on the interlayer insulation film 17. Then, an etching process is carried out to thereby open connection holes 18, 78 on the interlayer insulation film 17. After that, plugs 19, 79 are formed within the connection holes 18, 78. Those plugs 19, 79 are formed by embedding conductor (for example, the doped poly-silicon) in the connection holes 18, 78 and then removing an excessive portions of the conductor formed outside the connection holes 18, 78.

Figure 5:
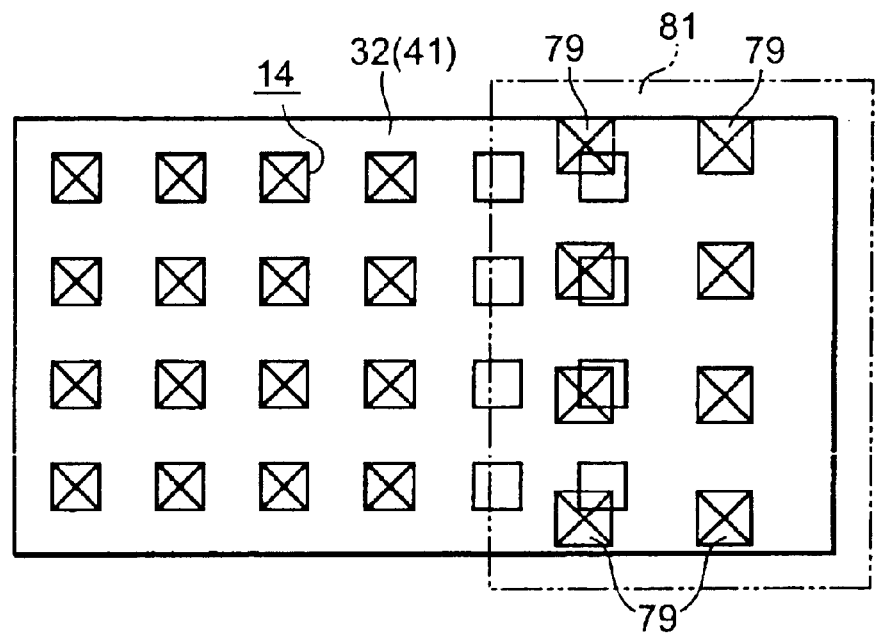
FIG. 5 is a layout view of showing the connecting method between the power supply wiring and the conductor film embedded in the groove.

Furthermore, conductor films are formed for forming the bit line and a power supply wiring on the interlayer insulation film 17 including the plugs 19, 79. The conductor film comprises, for example, tungsten film. Next, after formation of a resist film serving as a mask during formation of the bit line, a lithography process is used to form a mask pattern (not shown) comprising the resist film. The mask pattern is utilized to carry out an etching process and consequently form the bit line 20 comprising the conductor film connected to the drain region 16 and form the power supply wiring 91 connected to the conductor film 41 via the plug 79. The memory cell array is formed by carrying out the above-mentioned processes In the manufacturing method, as shown in FIG. 5, the grooves 14 are formed so as to be connected to each other.

Accordingly, the conductor films 41 left within the groove 14 are connected to each other, and the conductor film 41 in a portion covered by the resist 81 is connected to the conductor film 41 formed within the groove 14. Hence, by connecting the power supply wiring 91 via the plug 79 to the conductor film 41 on the substrate 10 (refer to FIG. 4C), the power can be supplied to the plate electrode 32 within the groove 14 as well.

Further, the semiconductor apparatus described with reference to FIGS. 1A to 1C may have the configuration shown in FIG. 4C and FIG. 5. That is, as described with reference to FIGS. 1A to 1C, the grooves 14 are formed so as to have repeating grid-shape, and the conductor films 41 are repeatedly formed within the groove 14. Furthermore, the conductor film 41 is formed so that portions of the conductor film 41 are pulled out from the substrate 10. The power supply wiring 91 is connected via the plug 79 to the conductor film 41 on the substrate 10. Utilization of the above-mentioned configuration enables power to be supplied from the power supply wiring 91 to the plate electrode 32 within the groove 14.

A semiconductor memory according to a second embodiment of the present invention will be described below with reference to FIG. 6 and FIGS. 7A, 7B. Further, in FIG. 6 and FIGS. 7A, 7B, the same numeric codes are assigned to configuration elements similar to those described in FIGS. 1A to 1C.

Figure 6:
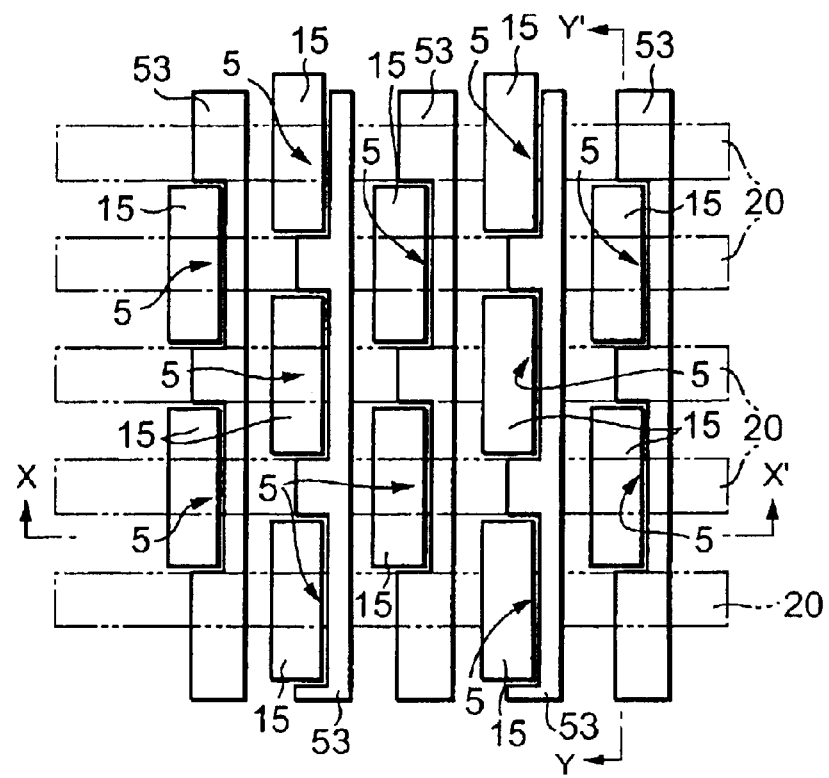
FIG. 6 is a layout plan view showing a second embodiment according to a semiconductor memory of the present invention.
Figure 7A:
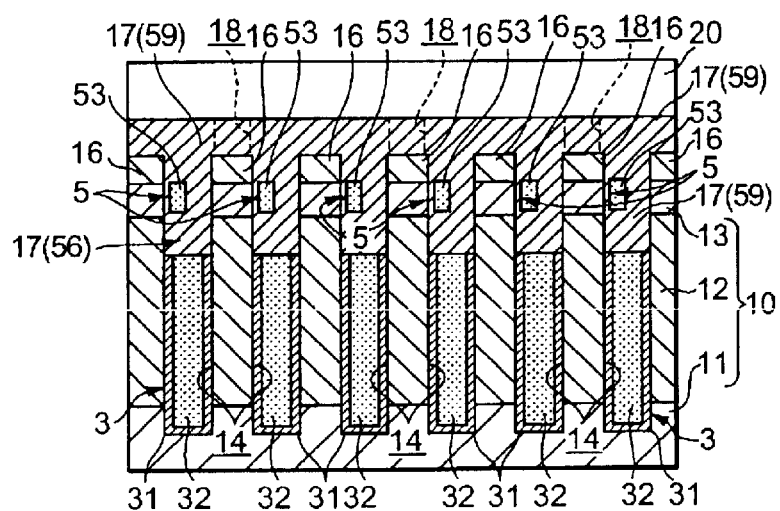
FIG. 7A is a sectional view of a schematic configuration on an X—X' line in the layout plan view of FIG. 6, and shows the second embodiment according to the semiconductor memory of the present invention.
Figure 7B:
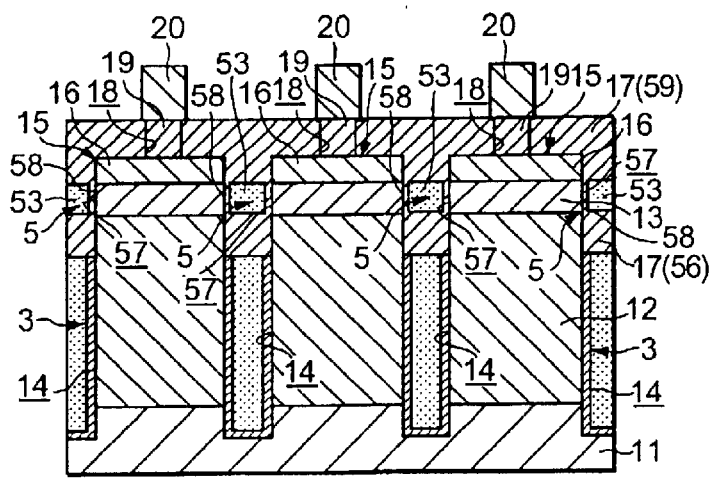
FIG. 7B is a sectional view of a schematic configuration on a Y—Y' line in the layout plan view of FIG. 6.

As shown in FIG. 6 and FIGS. 7A, 7B, a shape of a cross-section of a semiconductor pillar (hereafter, referred to as the silicon pillar) 15 is rectangular-shaped, and a longitudinal insulated gate static induction transistor 5 is formed on one side thereof.

That is, a first semiconductor layer 12 with higher concentration (N+ type) of the second conductive type, in which polarity is opposite to that of the first conductive type, is formed on a semiconductor substrate 11 of the first conductive type (hereafter, referred to as the P type). The silicon substrate of the P type is used in the semiconductor substrate 11. Further, the silicon layer of the N+ type is used in the first semiconductor layer 12. A second semiconductor layer 13 of the second conductive type (N− type) of the lower concentration than that of the first semiconductor layer 12 is formed on the first semiconductor layer 12. The second semiconductor layer 13 comprises N− type silicon layer. A substrate 10 is configured as mentioned above.

A groove 14 trenched down from the second semiconductor layer 13 to the semiconductor substrate 11 is formed on a predetermined region of the substrate 10. The predetermined region is the grid-shaped region in the region where the memory cell array is formed. The silicon pillars 15 have a rectangular section and are separated by grid-shaped grooves 14. The silicon pillars 15 are arrayed so as to be separated by a predetermined distance in a row direction, every other row. In the present embodiment, they are configured to be separated by about ⅔ of a long side of the rectangular section in a longitudinal direction (the long-side direction) of the rectangular section of the silicon pillar 15.

Conductor is embedded via capacitor insulation film 31 within the groove 14 so that the top side of the embedded conductor is lower than that of the first semiconductor layer 12. A capacitor plate electrode 32 is configured with such conductor. Accordingly, the capacitor plate electrode 32 is insulated from the semiconductor substrate 11 and the first semiconductor layer 12 by the capacitor insulation film 31.

A portion corresponding to the first semiconductor layer 12 in the silicon pillar 15 is doped at the higher concentration. Such portion functions as a charge accumulation electrode 33 of the capacitor in the DRAM. The capacitor insulation film 31 is mainly comprises nitride silicon film, and is, for example, formed at the film thickness of between 2 nm and 10 nm, and preferably formed at the film thickness of between 2 nm and 5 nm. Formation having the above-mentioned film thickness enables the capacitance of the capacitor to be maximized and also enables a large charge accumulation amount to be maintained.

Further, a semiconductor region of the second conductive type (N+ type) of the higher concentration than that of the second semiconductor layer 13 is formed on the top surface of the silicon pillar 15, and the N+ type semiconductor region becomes a drain region 16 of the insulated gate static induction transistor.

Furthermore, first interlayer insulation films 56 are formed on the plate electrode 32 and the substrate 10. First interlayer insulation film 56 comprises, for example, oxide silicon. On the first interlayer insulation film 56, a groove 57 that forms a word line is configured so as to expose only one side wall of the silicon pillar 15. Furthermore, the word line 53 (including even the gate electrode) is formed via gate insulation film 58 on the side wall of the silicon pillar 15 within the groove 57. The word line (gate electrode) 53 is formed via the gate insulation film 58 on a side of the second semiconductor layer 13 in the silicon pillar 15.

Accordingly, on a side of the silicon pillar 15, for example, the top surface of the word line (gate electrode) 53 is formed so as to be disposed at a level approximately as high as the top surface of the second semiconductor layer 13, and the bottom surface of the word line (gate electrode) 53 is formed so as to be about as high as the bottom surface of the second semiconductor layer 13. In the first interlayer insulation film 56 between the word line (gate electrode) 53 and the plate electrode 32 of the capacitor, a minimum thickness is kept so as to secure insulation and separation functions between the plate electrode 32 and the gate electrode 53.

Further, the gate insulation film 58 is, for example, formed at a film thickness of between 2 nm and 10 nm and preferably formed at a film thickness between 2 nm and 5 nm. Here, the gate insulation film 58 is formed at the thickness of 10 nm.

Furthermore, the groove 57 is trenched, and second interlayer insulation film 59 is formed on the first interlayer insulation film 56. A surface of the second interlayer insulation film 59 is planarized. The second interlayer insulation film 59 comprises, for example, oxide silicon film. FIGS. 7A, 7B show a case in which the surface of the first interlayer insulation film 56 is exposed by the planarizing process so that the second interlayer insulation film 59 is left only within the groove 57. Alternatively, the second interlayer insulation film 59 may be left on the first interlayer insulation film 56. Hereafter, the second interlayer insulation films 56, 59 are explained as the interlayer insulation film 17.

Connection holes 18 reaching a drain region 16 formed on the silicon pillar 15 is fabricated on the interlayer insulation film 17. A plug 19 connected to the drain region 16 is formed within the connection hole 18. Furthermore, a bit line 20 of the memory cell array is connected on the interlayer insulation film 17, so as to connect the plug 19.

In the insulated gate static induction transistor 5 having the above-mentioned configuration, a current flows in a longitudinal direction. Namely, such transistor 5 is a longitudinal insulated gate static induction transistor. In the longitudinal insulated gate static induction transistor, the word line (gate electrode) 53 is laid on one side of the silicon pillar 15. Accordingly, a channel of the insulated gate static induction transistor 5 is formed in a portion corresponding to the second semiconductor layer 13 of the silicon pillar 15.

The second embodiment is designed in such a way that if one word line 53-1 is selected, a memory cell M22 connected to a bit line 20-2 adjacent to a bit line 20-1 of a selected memory cell M11 is not selected, as shown in FIG. 8. In other words, the present embodiment is realized in a folded bit line system. Cells having such folded bit line system is known as being robust against noise.

The second embodiment has a merit that since an outer circumference length of the silicon pillar 15 can be formed at a longer length, a capacitor area determined by the product of the outer circumference length and the height may be made larger. Further, since a direction of a short side of the memory cell matches a direction along which the bit line 20 is extended, the bit line 20 may be made shorter. Assuming that a memory cell of 128 bits is connected to one bit line 20, a length of the bit line 20 may be obtained as the product of the length and the number of bits in the direction of the bit line 20 of the cell. In the conventional memory cell, since the bit line is formed in a longitudinal direction of the cell, the bit line is relatively longer. However, in the second embodiment of the present invention, the length of the bit line 20 may be made shorter since the bit line 20 is formed in a direction of the short side of the cell.

In the DRAM, a potential of the bit line accumulated in the memory cell is changed and such potential change is read out by using a sense amplifier. Accordingly, the smaller the parasitic capacitance of the bit line, the larger the change in the potential. Typically, when the capacitor capacitance of the memory cell is assumed to be Cs and the capacitance of the bit line is assumed to be Cb, reduction of a value Cb/Cs is advantageous to a cell operation. For this reason, the present embodiment is very much effective since the parasitic capacitance Cb may be reduced by making the wiring length shorter.

A second embodiment according to a method of manufacturing a semiconductor memory in the present invention will be described below with reference to FIGS. 9A, 9B and 9C and FIGS. 10A, 10B and 10C.

Figure 9A:
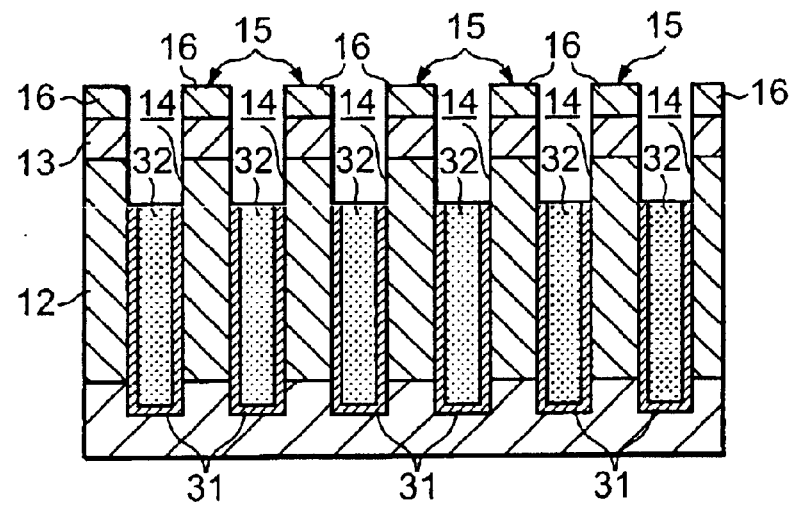
FIGS. 9A, 9B and 9C are sectional views of a schematic configuration showing a second embodiment according to a method of manufacturing the semiconductor memory of the present invention.

As shown in FIG. 9A, processes similar to those of the manufacturing method in the first embodiment are performed up to a process for forming the plate electrode 32 within the groove 14. That is, the N type semiconductor layer 12 and the N– type second semiconductor layer 13 are sequentially deposited on the P type semiconductor substrate 11. The substrate 10 is formed as described above. Furthermore, an ion implanting process is used to form the drain region 16 comprising the N+ type semiconductor region in the upper portion of the second semiconductor layer 13. Next, the semiconductor pillar (hereafter, referred to as the silicon pillar) 15 is formed by forming the groove 14 reaching down to the semiconductor substrate 11. Next, the capacitor insulation film 31 is formed on the silicon surface within the groove 14, for example, by means of nitride silicon film. Furthermore, the plate electrode 32 of the capacitor is formed within the groove 14. At this time, the top surface of the plate electrode 32 is formed so as to be lower than the top surface of the first semiconductor layer 12.

Figure 9B:
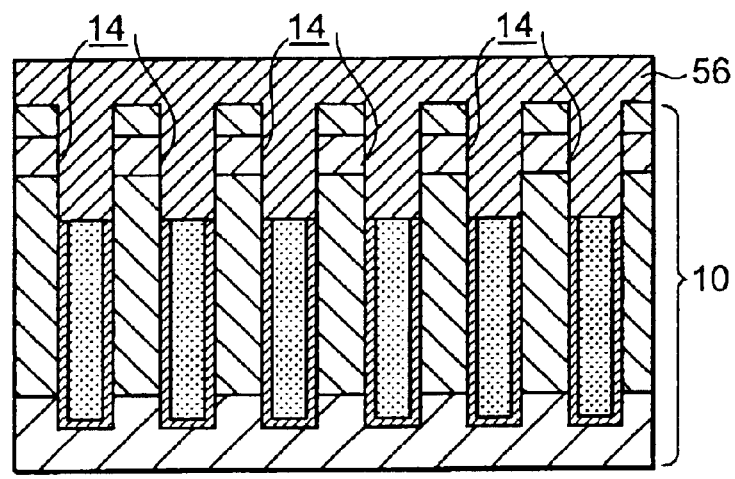

Next, as shown in FIG. 9B, inside of the groove 14 is filled up, and the first interlayer insulation film 56 is formed on the substrate 10. Next, the surface of the first interlayer insulation film 56 is planarized by the chemical mechanical polishing process.

Figure 9C:
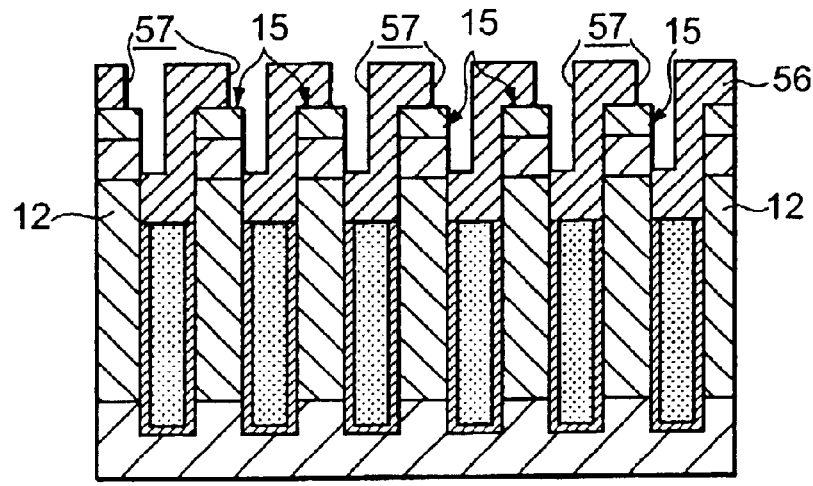

After that, as shown in FIG. 9C, by using a lithography technique and an etching technique, the groove 57 where the word line is formed is fabricated so as to expose one side of the silicon pillar 15. At this time, the bottom of the groove 57 is formed so as to be about as high as the top surface of the first semiconductor layer 12 or slightly higher than that.

Figure 10A:
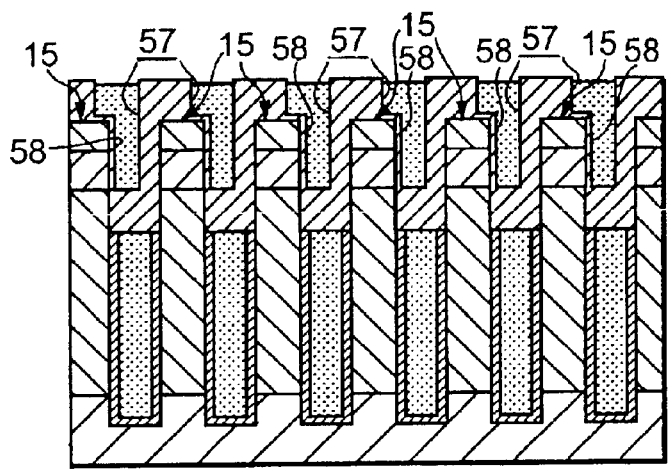
FIGS. 10A, 10B and 10C are sectional views of a schematic configuration showing the second embodiment according to the method of manufacturing the semiconductor memory of the present invention.

Next, as shown in FIG. 10A, by oxidizing the exposed silicon surface, the gate insulation film 58 of the longitudinal insulated gate static induction transistor is formed on the surface of the silicon pillar 15 within the groove 57. Here, the oxidization is performed in such a way that the thickness of the gate insulation film 58 becomes 10 nm.

Next, the conductor film 61 is formed, for example, by depositing phosphorous doped poly-silicon on the first interlayer insulation film 56 so as to embed in the groove 57. After that, the chemical mechanical polishing process is applied to remove the conductor film 61 on the first interlayer insulation film 56.

Figure 10B:
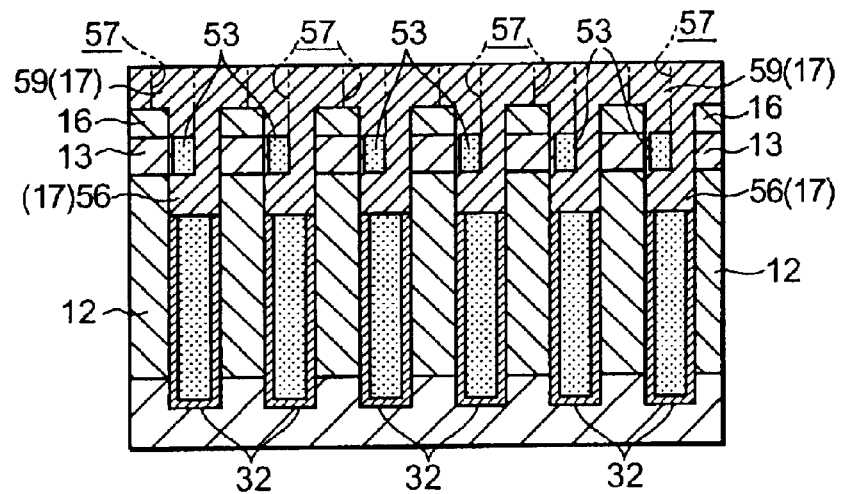

Furthermore, as shown in FIG. 10B, the conductor film 61 (refer to FIG. 10A) is etched in the isotropic manner to thereby form the word line (gate electrode) 53. As for the word line (gate electrode) 53, for example, on the side of the silicon pillar 15, the top surface of the word line (gate electrode) 53 is formed so as to be positioned at about as high as the top surface of the second semiconductor layer 13, and the bottom surface of the word line 53 (gate electrode) is formed so as to be positioned at about as low as the bottom surface of the second semiconductor layer 13. In the first interlayer insulation film 56, between the word line 53 (gate electrode) and the plate electrode 32 of the capacitor, the minimum thickness is kept so that insulation and separation between the plate electrode 32 and the word line (gate electrode) 53 may be secured Furthermore, the second interlayer insulation film 59 is formed, for example, by depositing oxide silicon film on the first interlayer insulation film 56 so as to fill in the groove 57 formed on the word line (gate electrode) 53. Hereafter, a combination of the first interlayer insulation film 56 and the second interlayer insulation film 59 is referred to as the interlayer insulation film 17. After the deposition, the surface of the interlayer insulation film 17 is planarized, for example, by a chemical mechanical polishing process. FIG. 10B shows a case in which the surface of the first interlayer insulation film 56 is exposed by the planarizing process so that the second interlayer insulation film 59 remains only within the groove 57. Alternatively, the second interlayer insulation film 59 may be left on the first interlayer insulation film 56.

Figure 10C:
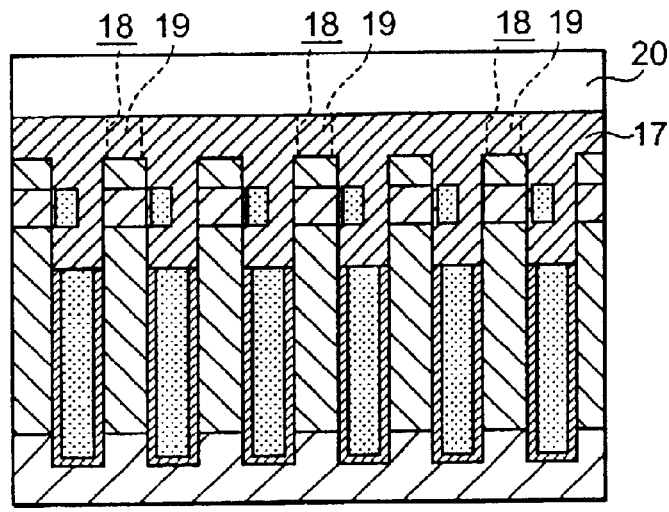
Figure 11A:
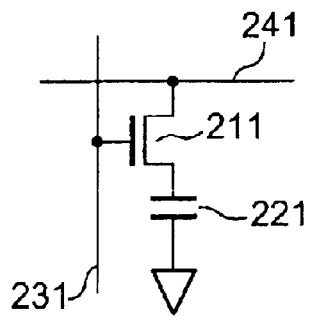
FIGS. 11A, 11B and 11C are circuit diagrams describing a configuration of a conventional DRAM.
Figure 11B:
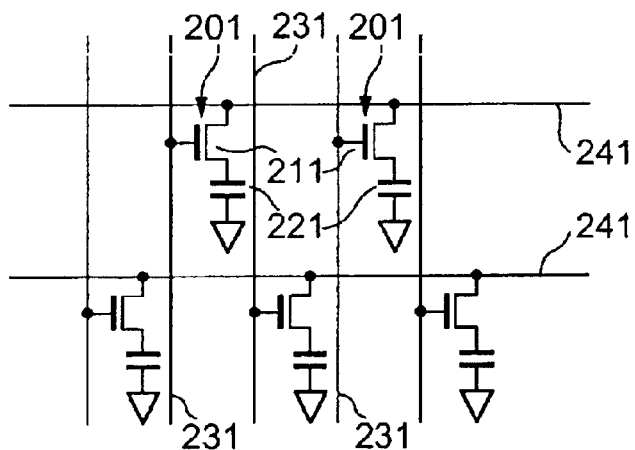
Figure 11C:
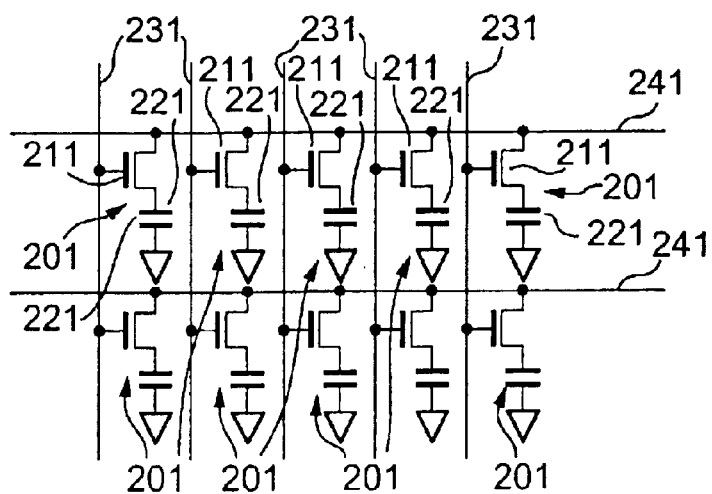

Next, the bit contacts are opened as shown in FIG. 10C. A typical resist coating and lithography processes are used to form the mask pattern (not shown) to form the connection hole serving as the bit contact hole on the interlayer insulation film 17. Then, the etching is carried out to thereby open the connection hole 18 on the interlayer insulation film 17. After that, the plug 19 is formed within the connection hole 18. The plug 19 is formed by filling the conductor (for example, the doped poly-silicon) in the connection hole 18 and then removing an excessive portion of the conductor formed outside the connection hole 18.

Furthermore, conductor film is formed for forming the bit line on the interlayer insulation film 17 including a portion over the plug 19. The conductor film comprises, for example, tungsten film. Next, after formation of a resist film serving as a mask during formation of the bit line, a lithography process is used to form a mask pattern (not shown) comprising the resist film. The mask pattern is used to carry out an etching process and consequently form the bit line 20 comprising conductor film connected to the drain region 16. The memory cell array similar to that described with reference to FIG. 6 and FIGS. 7A, 7B is formed by carrying out the above-mentioned processes.

In the second embodiment, the formation of the word line 53 is performed by filling in the groove 57 formed on the first interlayer insulation film 56, and the transistor may be formed on one side of the silicon pillar 15. Accordingly, there is advantage of easiness in processing the word line 52.

In the respective embodiments, the chemical mechanical polishing process is used for planarizing the oxide film and the like. Alternatively, other process such as an etch-back process may be employed for carrying out the planarizing process.

According to the semiconductor memory according to the embodiments of the present invention as mentioned above, the capacitor for accumulating charge, the insulated gate static induction transistor and the bit line are formed in the structure in which they are longitudinally piled up, and the separation between the respective memory cells are realized by the plate electrode of the capacitor embedded in the groove. Accordingly, a smaller average plane area occupied by the memory cell may be achieved, thereby promoting further miniaturization of the memory cell.

Further, the longitudinal insulated gate static induction transistor is used as the word transistor of the memory cell. Thus, even if the gate length of the transistor is made longer, it does not cause a size of the cell area to be increased. Hence, it is possible to set the gate length of the transistor with sufficient margin. Further, a capacitance of the capacitor for accumulating charge may be made larger by increasing the length of the charge accumulation portion in the depth direction. Accordingly, the required capacitance may be secured without any severe limitation even if the miniaturization is further advanced.

As mentioned above, according to the method of manufacturing the semiconductor memory according to the embodiments of the present invention, the capacitor for accumulating charge, the insulated gate static induction transistor and the bit line are formed in the structure in which they are longitudinally piled up, and the separation between the respective memory cells are formed in the plate electrode of the capacitor embedded in the groove. Accordingly, a smaller plane area occupied by the memory cell may be achieved.

After the formation of the groove, the conductor is embedded via the thin insulation film to thereby form the plate electrode. Furthermore, the conductor is embedded via the insulation film to thereby form the word line. Thus, the process is made easier. Further, the formation of the fine contact within the memory cell is done only by using the bit contact to connect the bit line. Hence, the process is simplified to thereby reduce load of the manufacture.

Further, the gate of the longitudinal insulated gate static induction transistor is extended in the depth direction. Thus, even if the gate length of the transistor is made longer, this does not cause increasing of a cell area size. Thus, it is possible to form the transistor of the gate length having sufficient margin. Further, a capacitance of the capacitor for accumulating charge may be made larger by increasing a length of the charge accumulation portion in the depth direction. Accordingly, even if miniaturization is further advanced, no severe limitation is imposed on the plane occupation area, and it is possible to form the capacitor having a larger capacitance. Accordingly, the capacitor with sufficiently large capacitance may be obtained.

Further, according to the embodiments of the present invention, the first semiconductor layer of the second conductive type of the higher concentration is formed on the P type semiconductor substrate, and the second semiconductor layer of the second conductive type of the lower concentration than that of the first semiconductor layer is further formed thereon. Thus, a CMOS LSI circuit may be easily formed on the second semiconductor layer by utilizing a conventional CMOS process. Accordingly, the processes used in the DRAM cell formation are well consistent with that of the CMOS.

Furthermore, the first semiconductor layer disposed in the lower portion of the CMOS circuit corresponds to a region where unnecessary carriers are induced in a silicon substrate by receiving α particles and recombined quickly. Thus, the present invention is effective for so-called soft error, which is a circuit operation defect caused by the α particles.

Furthermore, the embodiments of the present invention may be applicable to any of the open bit line systems, as shown in the first embodiment. Furthermore, it may be applicable to even the folded bit line system, as shown in the second embodiment. Accordingly, the present invention enables to provide the memory cell for flexible circuit configuration.

Although the present invention has been described in its preferred form with a certain degree of particularity, obviously many changes, combinations and variations are possible therein. It is therefore to be understood that the present invention may be practiced otherwise than as specifically described herein without departing from the scope of the present invention.

What is claimed is:

1. A semiconductor dynamic random access memory, wherein:
    said dynamic random access memory includes memory cells, each of said memory cells comprising:
        a semiconductor pillar,
        a capacitor in which a first portion of said semiconductor pillar is used as an electrode of said capacitor, and
        a longitudinal insulated gate static induction transistor in which a second portion of said semiconductor pillar is used as an active region of said transistor, and
        said semiconductor pillar being connected to a bit line; and
        the semiconductor pillar formed of a layer structure comprising:
            a semiconductor substrate of a first conductive type,
            a first semiconductor layer of a second conductive type formed on said semiconductor substrate of the first conductive type, and
            a second semiconductor layer of the second conductive type formed on said first semiconductor layer, said second semiconductor layer having a lower concentration than that of said first semiconductor layer,
        grooves formed in predetermined regions and trenched down to said semiconductor substrate to thereby form adjacent pillars,
        said semiconductor pillar mainly comprising said first semiconductor layer, and being formed in a pillar form and disposed between said grooves, a plate electrode of said capacitor embedded within said groove adjacent said first semiconductor layer with a capacitor insulation film therebetween, a word line and a gate electrode of said insulated gate static induction transistor comprising an embedded conductor positioned adjacent to said plate electrode, and said first semiconductor layer and said second semiconductor layer with an insulation film therebetween, a drain region of said insulated gate static induction transistor comprising a semiconductor region of the second conductive type formed at a top of said semiconductor pillar, and a bit line of a memory cell array connected to said drain region.

2. A semiconductor memory according to claim 1, wherein:

said gate electrode of said insulated gate static induction transistor within said memory cell is formed such that it is adjacent to said semiconductor pillar.

3. A semiconductor memory according to claim 1, wherein:

said gate electrode of said insulated gate static induction transistor within said memory cell is formed adjacent to a portion of a side wall of said semiconductor pillar with a gate insulation film therebetween.

4. A semiconductor memory according to claim 1, wherein said plate electrode is embedded in said groove and is connected to a power supply wiring.

5. A semiconductor memory according to claim 1, wherein:

said semiconductor pillars are arrayed so as to be separated by a predetermined distance in a row direction.

6. A semiconductor memory according to claim 5, wherein:

a word line related to operation of a memory cell is the gate electrode of the transistor for a cell in every other row among adjacent cells arrayed in a direction along which said bit line is laid.

7. A semiconductor memory including memory cells, said semiconductor memory comprising:

(1) a layer structure including
   a semiconductor substrate of a first conductive type,
   a first semiconductor layer of a second conductive type formed on said semiconductor substrate of the first conductive type, and
   a second semiconductor layer of the second conductive type formed on said first semiconductor layer, said second semiconductor layer having a lower concentration than that of said first semiconductor layer, (2) a groove formed in predetermined regions and trenched down to said semiconductor substrate, (3) semiconductor pillars mainly comprising said first semiconductor layer, and being formed in a pillar form and disposed between said grooves, (4) a capacitor in which one side of said semiconductor pillar is used as an electrode of said capacitor, said capacitor comprising a plate electrode comprising a conductor embedded within said groove positioned adjacent said semiconductor substrate and said first semiconductor layer with a capacitor insulation film therebetween, (5) a longitudinal insulated gate static induction transistor in which a portion of said semiconductor pillar is used as an active region of said transistor, (6) a word line, and a gate electrode of said insulated gate static induction transistor comprising an embedded conductor so as to be positioned adjacent said plate electrode, and said first semiconductor layer and said second semiconductor layer with an insulation film therebetween, (7) a drain region of said insulated gate static induction transistor comprising a semiconductor region of the second conductive type formed at a top of said semiconductor pillar, and (8) a bit line of a memory cell array connected to said drain region.

* * * * *